(12) United States Patent
Jeon et al.

(10) Patent No.: US 12,324,110 B2
(45) Date of Patent: Jun. 3, 2025

(54) POWER CONVERSION APPARATUS INCLUDING A FILTER MODULE

(71) Applicant: LG INNOTEK CO., LTD., Seoul (KR)

(72) Inventors: Ji Hwan Jeon, Seoul (KR); Sang Hun An, Seoul (KR); Ji Ho Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 180 days.

(21) Appl. No.: 18/019,061

(22) PCT Filed: Aug. 2, 2021

(86) PCT No.: PCT/KR2021/010058
§ 371 (c)(1),
(2) Date: Jan. 31, 2023

(87) PCT Pub. No.: WO2022/025733
PCT Pub. Date: Feb. 3, 2022

(65) Prior Publication Data
US 2023/0318476 A1    Oct. 5, 2023

(30) Foreign Application Priority Data
Jul. 31, 2020    (KR) .................. 10-2020-0096142

(51) Int. Cl.
*H05K 5/02* (2006.01)
*H05K 7/20* (2006.01)

(52) U.S. Cl.
CPC ....... *H05K 5/0217* (2013.01); *H05K 7/20181* (2013.01)

(58) Field of Classification Search
CPC ............ H05K 5/0217; H05K 7/20909; H05K 7/20181; H02M 7/003
See application file for complete search history.

(56) References Cited

U.S. PATENT DOCUMENTS

| 8,951,322 B2* | 2/2015 | Pfannenberg ......... F04D 29/703 |
| | | 55/467 |
| 9,907,211 B2* | 2/2018 | Campbell .......... H05K 7/20181 |
| 10,653,992 B2* | 5/2020 | Chen .................. H05K 7/20736 |

(Continued)

FOREIGN PATENT DOCUMENTS

| JP | 6407480 B1 | 10/2018 |
| KR | 10-2013-0084231 A | 7/2013 |
| KR | 10-1586399 B1 | 1/2016 |

(Continued)

*Primary Examiner* — James Wu
*Assistant Examiner* — Dakota M Talbert
(74) *Attorney, Agent, or Firm* — Birch, Stewart, Kolasch & Birch, LLP (57) ABSTRACT

A power conversion apparatus comprises: a housing including an opening; and a filter module coupled to the opening, wherein the filter module includes: a first filter; a second filter disposed inside the first filter; and a frame coupled to side surfaces of the first filter and the second filter, the first filter includes a plurality of filter units spaced apart in the vertical direction, and an upper surface of the filter unit has an inclined surface formed thereon such that the distance to a bottom surface of the housing becomes closer toward the outside.

15 Claims, 7 Drawing Sheets

(56) References Cited

U.S. PATENT DOCUMENTS

2013/0067875 A1* 3/2013 Hartmann .............. B01D 46/10
  55/428
2019/0111375 A1 4/2019 Chen et al.

FOREIGN PATENT DOCUMENTS

KR 10-1785895 B1 10/2017
KR 10-2018-0008065 A 1/2018

* cited by examiner

POWER CONVERSION APPARATUS INCLUDING A FILTER MODULE

CROSS REFERENCE TO RELATED APPLICATIONS

This application is the National Phase of PCT International Application No. PCT/KR2021/010058, filed on Aug. 2, 2021, which claims priority under 35 U.S.C. 119(a) to Patent Application No. 10-2020-0096142, filed in the Republic of Korea on Jul. 31, 2020, all of which are hereby expressly incorporated by reference into the present application.

TECHNICAL FIELD

The present embodiment relates to a power conversion apparatus.

BACKGROUND ART

Recently, countries around the world are making various attempts to replace existing fossil energy resources. First of all, for the use of nature-friendly energy, intensive investment in the renewable energy industry for the use of nature-friendly energy and the energy distribution and storage industry for energy efficiency improvement has been going on, and in Korea, various policies for the energy industry are being planned and underway due to the shutdown of nuclear power plants and power outages following the earthquake in Japan, and looking at this trend of the times, demand for new and renewable energy is increasing, and in line with this, technologies for efficiently managing power, such as smart grids, are also being actively researched.

The problem of using energy efficiently leads to an analysis of demand patterns such as the place and time of users who use energy, and the core concept of smart grid is how to distribute the produced energy in consideration of the user's demand patterns.

Therefore, in order to store the produced energy in a certain time or space and supply it according to the usage pattern of the consumer, a storage device in which the produced energy can be stored, that is, a battery, is required, and the concept of expanding these batteries is called an energy storage system (ESS).

An energy storage system (ESS) is an energy storage system that controls various voltages and currents generated from distributed power or renewable energy to connect to a power system as needed or to store and use idle energy. The power conversion system (PCS) is a system that converts characteristics of electricity, that is, AC/DC, voltage, frequency, and the like to receive power from a power source within the energy storage system (ESS) and store it in a battery or discharge it to the grid.

As an example of a power conversion apparatus, a DC-DC converter refers to an electronic circuit device that converts DC power of a certain voltage to DC power of another voltage, and it is used in various fields such as television receivers, automotive electronic parts, and energy storage systems (ESS).

The outer shape of the power conversion apparatus is formed by the housing, and a number of electronic components for driving are disposed inside the housing. The plurality of electronic components generates heat by being driven.

For heat dissipation, the power conversion apparatus may include a fan for flowing air inside the housing. An opening through which air flows in and out may be formed in the housing so that air flows smoothly. However, there is a problem in that foreign substances including dust may flow in through the opening, and in particular, when moisture flows into the housing, it causes failure of electronic components.

DETAILED DESCRIPTION OF THE INVENTION

Technical Subject

The present embodiment is to provide a power conversion apparatus capable of preventing the inflow of foreign substances including moisture and dust into the housing by improving the structure.

Technical Solution

A power conversion apparatus according to the present embodiment comprises: a housing including an opening; and a filter module being coupled to the opening, wherein the filter module includes a first filter, a second filter being disposed inside the first filter, and a frame being coupled to side surfaces of the first filter and the second filter, wherein the first filter includes a plurality of filter units being spaced apart in a vertical direction, and wherein an upper surface of the filter unit has an inclined surface formed thereon such that the distance to a bottom surface of the housing becomes closer as it travels towards the outside.

The second filter may include a plurality of through holes.

An outer end portion of the filter unit may be formed to be rounded.

A first rib being protruded inward is formed on an inner surface of the frame, and a coupling hole to which the first rib is coupled may be disposed on a side surface of the filter unit.

The frame includes a side surface part and a bent portion being bent from a side end portion of the side surface part, the frame includes a second rib being protruded from an inner surface of the side surface part, and the second filter may be disposed between the second rib and the bent portion.

Each of the first rib and the second rib may be provided in plurality and spaced apart from each other in a vertical direction, and the plurality of first ribs may be disposed to be overlapped with a region between the plurality of second ribs.

An inner plate part being in contact with an outer surface of the second filter may be disposed at an inner side of the filter unit, and the inner plate part may be disposed between the plurality of second ribs in a vertical direction.

An upper surface part being disposed at an upper end of the first filter and a lower surface part being disposed at a lower end of the first filter, wherein a lower surface of the upper surface part is in contact with an upper surface of the second filter, an upper surface of the lower surface part may be in contact with an upper surface of the second filter.

The frame may include a hooking part being protruded from the side surface part and coupled to an outer surface of the housing.

The filter unit may have an acute angle with respect to an imaginary axis X forming a horizontal direction of the housing.

Advantageous Effects

According to the present invention, there is an advantage in preventing moisture and foreign substances from being introduced from the external region through a double filter structure including a first filter and a second filter while securing an air flow path for heat dissipation.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used.

These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
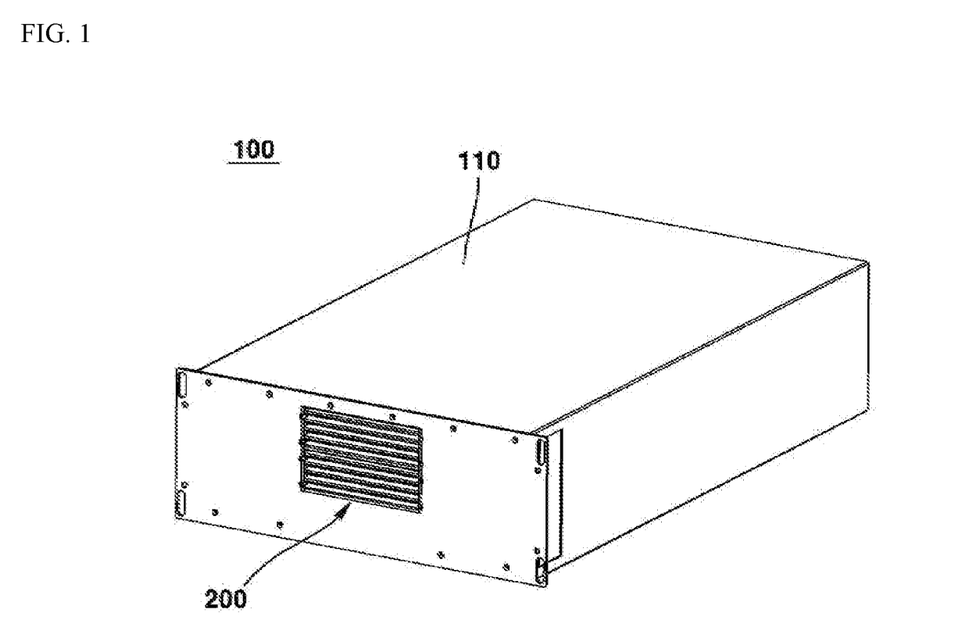
FIG. 1 is a perspective view illustrating the outer appearance of a power conversion apparatus according to an embodiment of the present invention.
Figure 2:
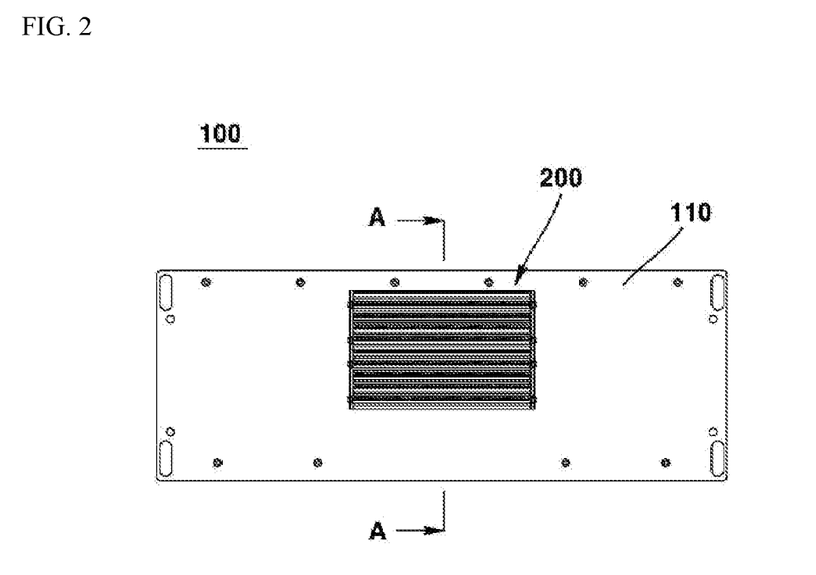
FIG. 2 is a plan view illustrating one side surface of a power conversion apparatus according to an embodiment of the present invention.
Figure 3:
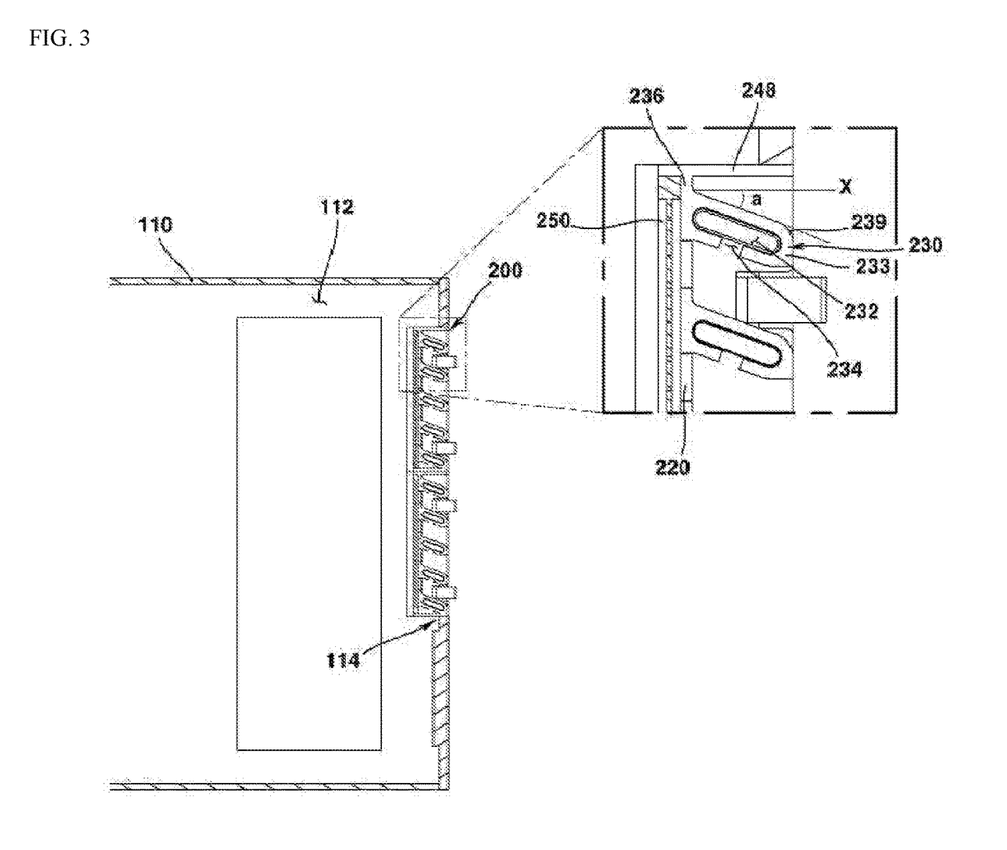
FIG. 3 is a cross-sectional view taken along line A-A' of FIG. 2.
Figure 4:
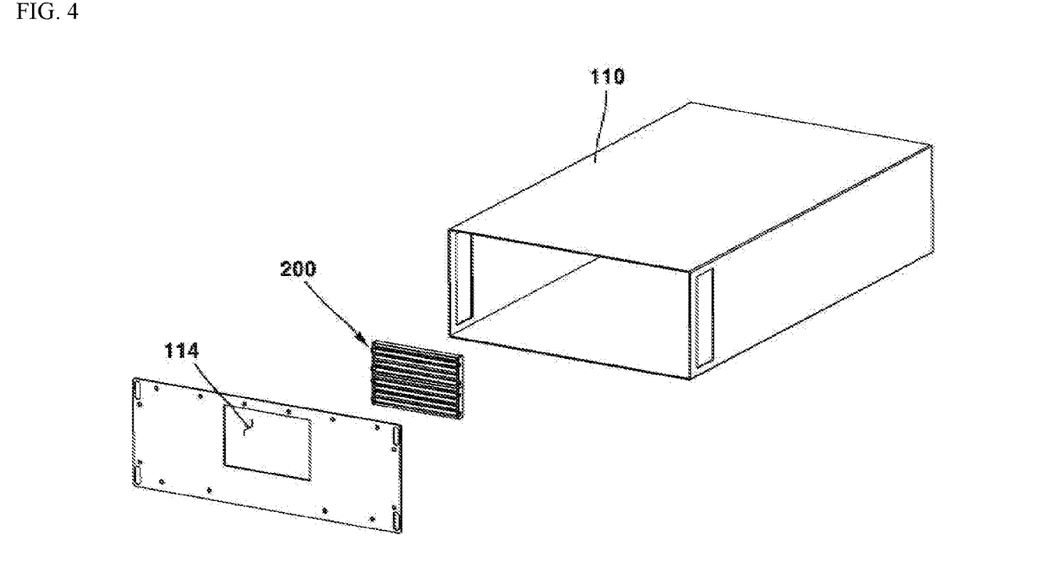
FIG. 4 is an exploded perspective view of a power conversion apparatus according to an embodiment of the present invention.
Figure 5:
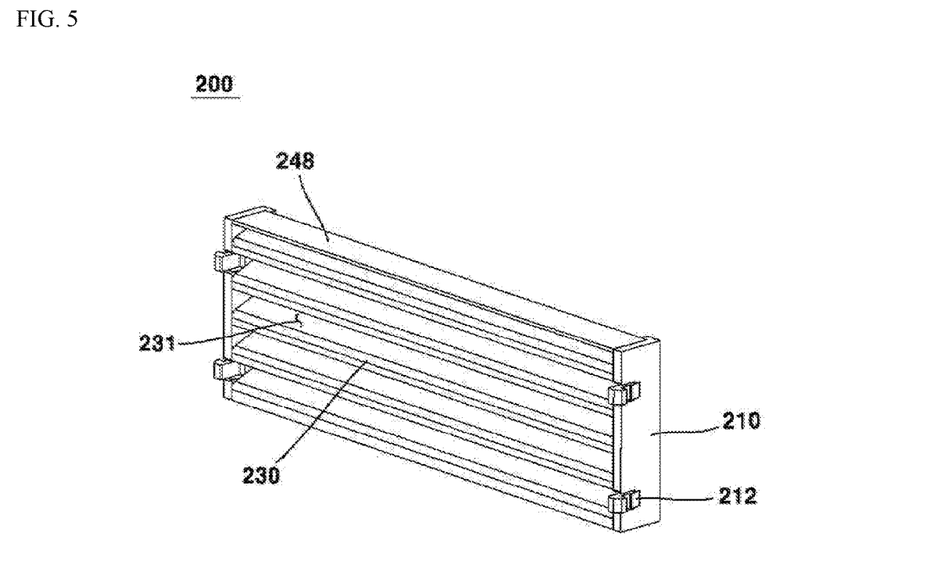
FIG. 5 is a perspective view illustrating an outer surface of a filter module according to an embodiment of the present invention.
Figure 6:
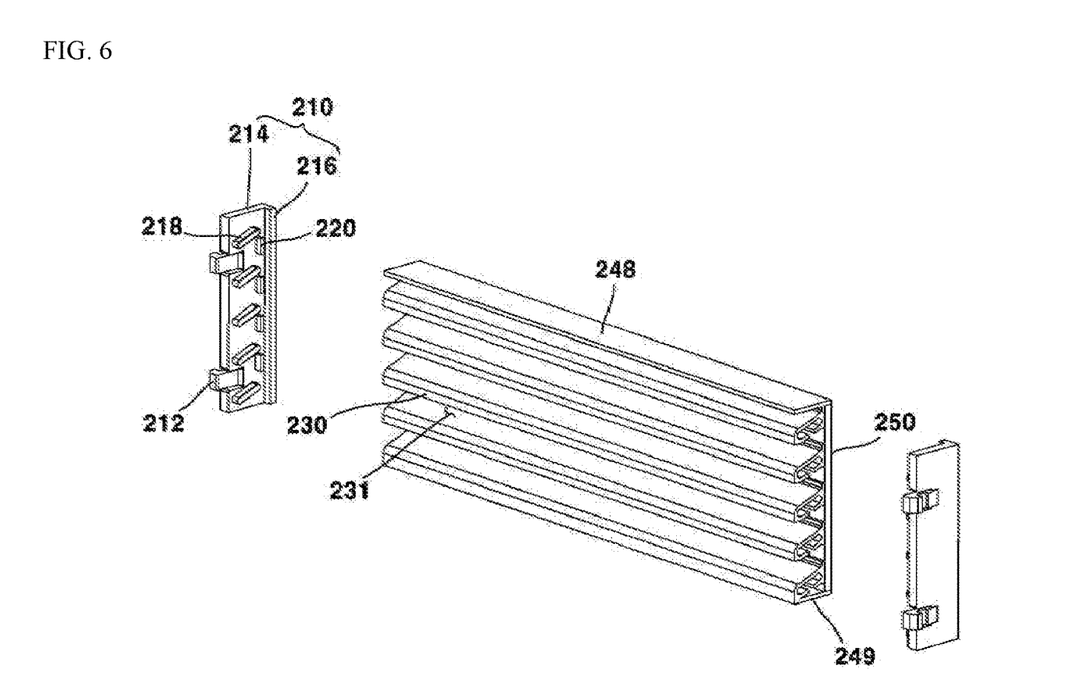
FIG. 6 is an exploded perspective view of an outer surface of a filter module according to an embodiment of the present invention.
Figure 7:
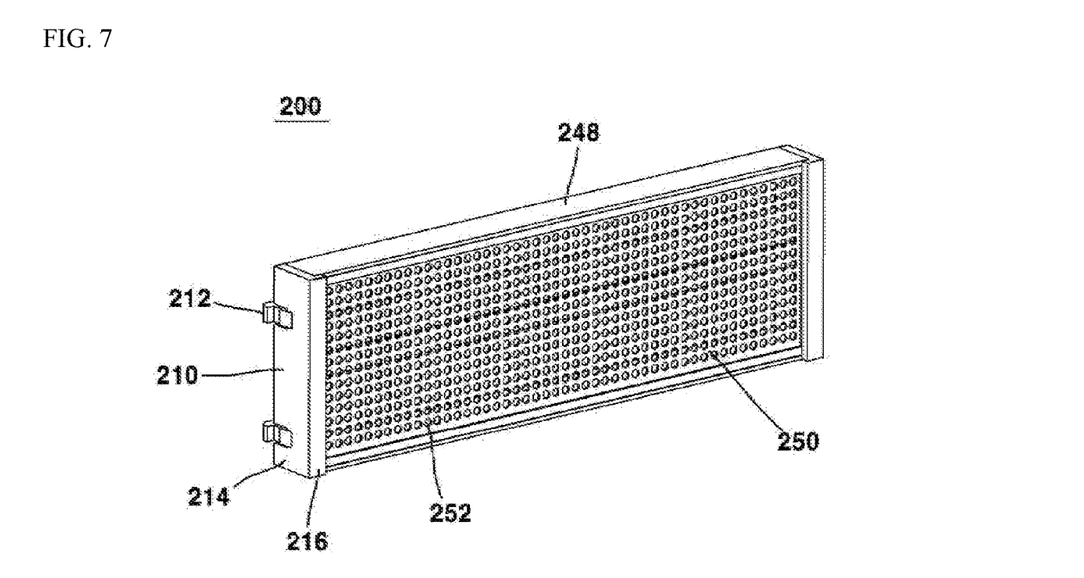
FIG. 7 is a perspective view illustrating an inner surface according to an embodiment of the present invention.
Figure 8:
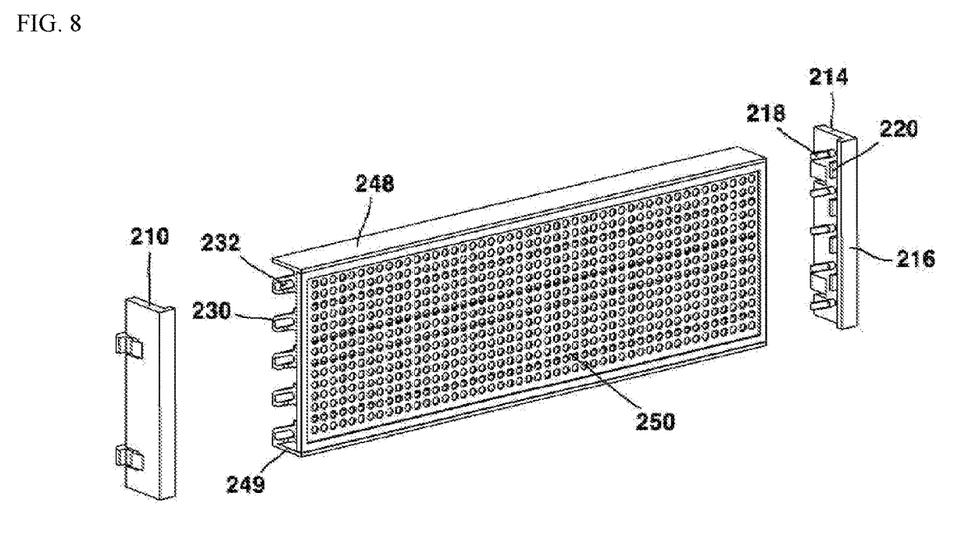
FIG. 8 is an exploded perspective view of an inner surface of a filter module according to an embodiment of the present invention.
Figure 9:
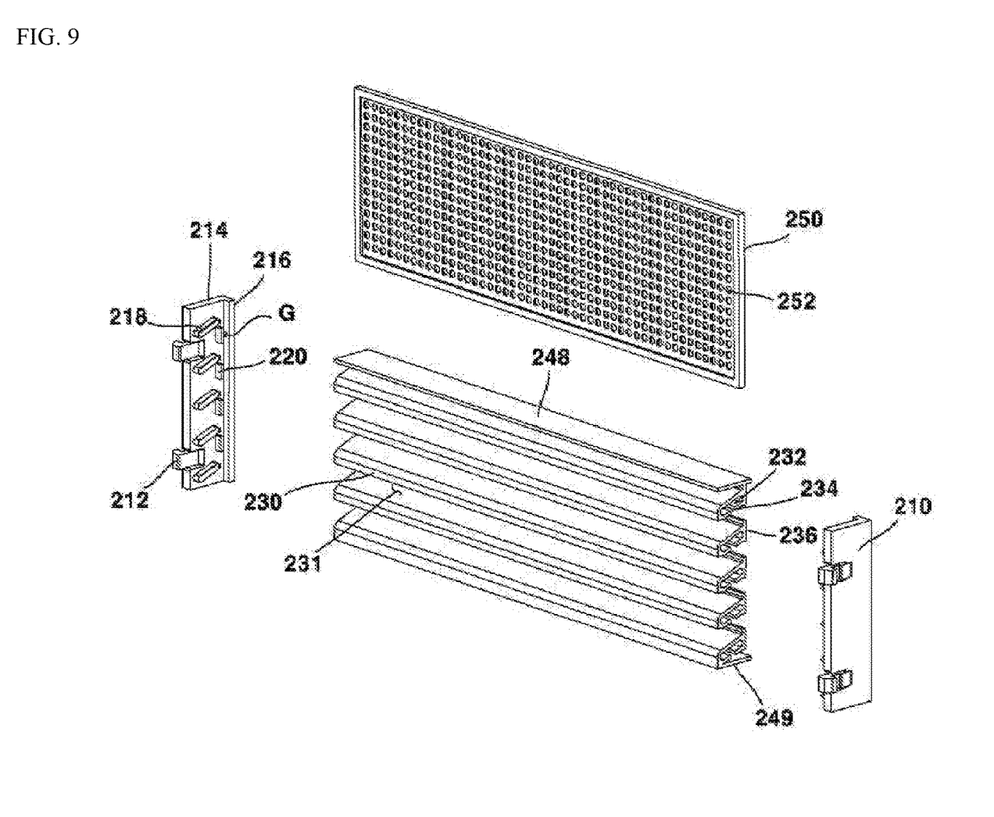
FIG. 9 is an exploded perspective view of a filter module in which a first filter and a second filter are disassembled according to an embodiment of the present invention.
Figure 10:
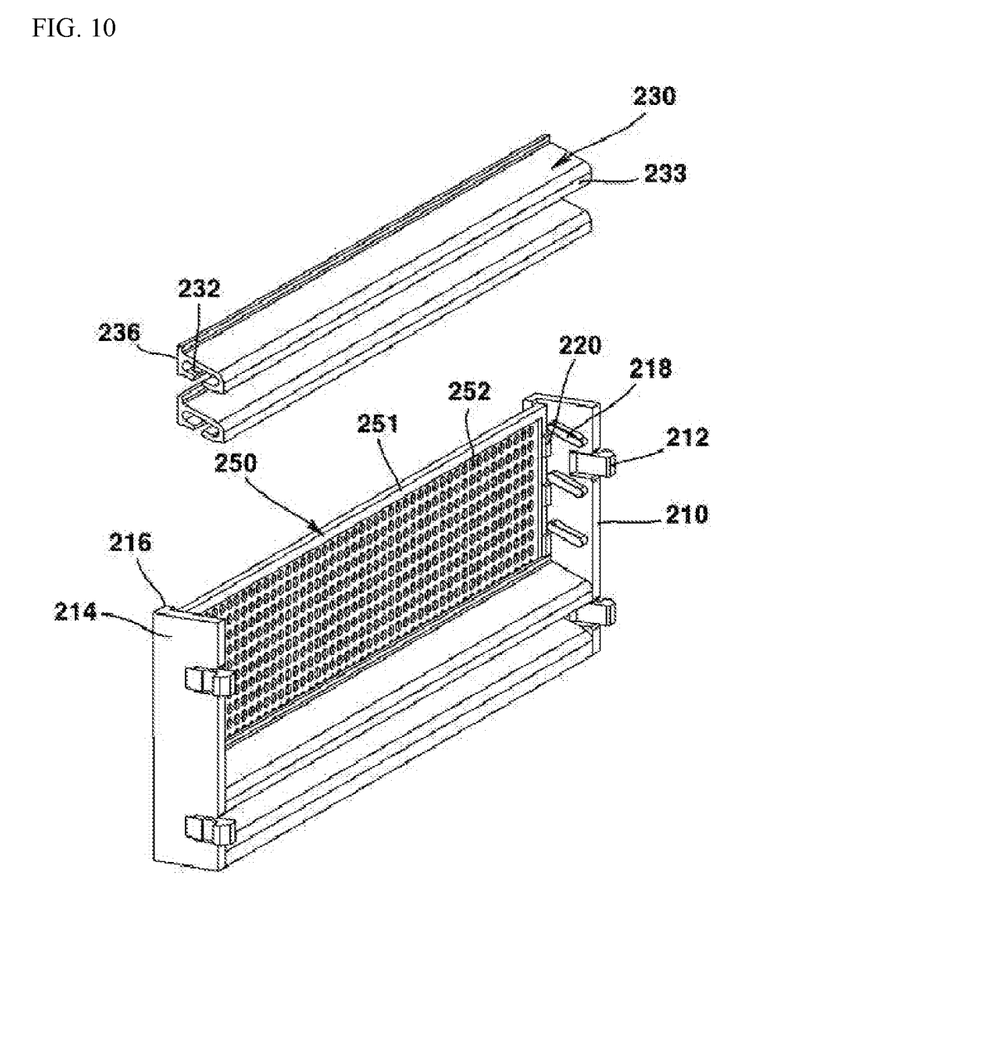
FIG. 10 is an exploded perspective view for explaining a coupling structure of a filter module according to an embodiment of the present invention.

FIG. 1 is a perspective view illustrating the outer appearance of a power conversion apparatus according to an embodiment of the present invention; FIG. 2 is a plan view illustrating one side surface of a power conversion apparatus according to an embodiment of the present invention; FIG. 3 is a cross-sectional view taken along line A-A' of FIG. 2; FIG. 4 is an exploded perspective view of a power conversion apparatus according to an embodiment of the present invention; FIG. 5 is a perspective view illustrating an outer surface of a filter module according to an embodiment of the present invention; FIG. 6 is an exploded perspective view of an outer surface of a filter module according to an embodiment of the present invention; FIG. 7 is a perspective view illustrating an inner surface according to an embodiment of the present invention; FIG. 8 is an exploded perspective view of an inner surface of a filter module according to an embodiment of the present invention; FIG. 9 is an exploded perspective view of a filter module in which a first filter and a second filter are disassembled according to an embodiment of the present invention; and FIG. 10 is an exploded perspective view for explaining a coupling structure of a filter module according to an embodiment of the present invention.

Referring to FIGS. 1 to 10, the power conversion apparatus 100 according to an embodiment of the present invention may have an external shape formed by a housing 110. A space (not shown) in which a plurality of electronic components is disposed may be formed inside the housing 110. The housing 110 may have a rectangular parallelepiped or regular hexahedron shape. A fan (not shown) may be disposed inside the housing 110 to flow air in the space. The fan may dissipate heat generated by driving the electronic component through air flow.

An opening 114 may be formed on an outer surface of the housing 110. The opening 114 may be a hole penetrating the inner surface from the outer surface of the housing 110. The opening 114 may be disposed on a side surface of the housing 110. The cross section of the opening 114 may be rectangular or square. Unlike this, the opening 114 may have a circular cross-sectional shape. The shape of the opening 114 is not limited.

A filter module 200 may be coupled to the opening 114. The filter module 200 may introduce air for smooth air flow inside the housing 110 and block the inflow of foreign substances including moisture and dust. When foreign substances, including moisture and dust, flow into the housing 110, it may cause problems in driving a plurality of electronic components disposed inside the housing 110, resulting in fire or malfunction of the power conversion apparatus 100.

The filter module 200 may include a frame 210, a first filter 230 and a second filter 250. In this specification, a configuration being formed by a combination of the first filter 230 and the second filter 250 may be referred to as a filter.

The frame 210 may be coupled to both sides of the first filter 230 and the second filter 250. To this end, the frame 210 may be provided in plurality. The frame 210 may be hooked to the housing 110 through the opening 114. The frame 210 may couple the filter to the opening 114.

In the frame 210, a surface facing the surface of the housing 110 forming the opening 114 is defined as an outer surface of the frame 210, and a surface where the first filter 230 and the second filter 240 are being coupled may be defined as an inner surface of the frame 210.

The frame 210 may include a region bent at least once. The frame 210 may include a side surface part 214 and a bent portion 216. The bent portion 216 may be bent from the side end portion of the side surface part 214 and extended a predetermined distance towards the inner side. The bent portion 216 may be disposed to surround a portion of the rear surface of the filter (second filter 250). Here, the rear surface of the filter may be a surface facing the inner space of the housing 110. The side surface part 214 may have a thickness greater than that of the housing 110. Accordingly, the filter module 200 may be protruded more inward than an inner surface of the housing 110. An outer surface of the filter module 200 may be disposed to form the same plane as an outer surface of the housing 110.

A hooking part 212 being hooked on an outer surface of the housing 110 may be formed on a side surface of the side surface part 214. The hooking part 212 may have a shape being protruded more than other regions on a side surface of the side surface part 214. A portion of the protruded region of the hooking part 212 may be caught on the outer surface of the housing 110. Accordingly, a portion of the protruded region of the hooking part 212 may be disposed on one region among the outer surface of the housing 110, and the filter module 200 may be hook-coupled to the housing 110. The hooking part 212 may be provided in plurality and spaced apart in a vertical direction.

A first rib 218 and a second rib 220 may be disposed on an inner surface of the side surface part 214. The first rib 218 and the second rib 220 may be protruded more inward than the other inner regions of the side surface part 214. The first rib 218 may be disposed closer to the side surface of the side surface part 214 than the second rib 220, that is, to a surface where the hooking part 212 is formed. The second rib 220 may be disposed closer to the bent portion 216 than the first rib 218.

The first ribs 218 may be provided in plurality and spaced apart from each other along a vertical direction, which is a lengthwise direction of the frame 210. The second rib 220 may be provided in plurality and spaced apart from each other along a vertical direction, which is a lengthwise direction of the frame 210. One region of the plurality of first ribs 218 may be disposed to be overlapped with a region between the plurality of second ribs 220 in a horizontal direction perpendicular to the vertical direction. One region of the plurality of second ribs 220 may be disposed to be overlapped with a region between the plurality of first ribs 218 in a horizontal direction. Also, the plurality of second ribs 220 may be disposed to be overlapped with one region with the plurality of first ribs 218 in a vertical direction.

The first rib 218 may be coupled to the first filter 230, which will be described later. Accordingly, the shape of the first rib 218 may be formed to correspond to the shape of the coupling hole 232 (see FIG. 9) of the first filter 230.

The second rib 220 may fix the second filter 250 inside the frame 210. To this end, a gap may be formed between the second rib 220 and the bent portion 216 to correspond to the thickness of the second filter 250. Therefore, an outer surface of the second filter 250 is in contact with one side of the second rib 220, and an inner surface of the second filter 250 is in contact with an outer surface of the bent portion 216, and in here, an outer surface of the bent portion 216 may be a region facing one side surface of the second rib 220, and accordingly, the second filter 250 is disposed between the second rib 220 and the bent portion 216, thereby possibly being fixed inside the frame 210.

The length of the frame 210 the vertical direction of may correspond to the length of the vertical direction of the first filter 230 or the second filter 250.

The first filter 230 is disposed on an outer surface of the filter module 200 to prevent moisture from entering into the housing 110. The first filter 230 may be disposed at an outer side of the second filter 250. An outer surface of the first filter 230 may form the same plane as an outer surface of the housing 110. An outer surface of the first filter 230 may be exposed to the outside.

The first filter 230 may be formed by combining a plurality of filter units 233. The plurality of filter units 233 may be disposed spaced apart in a vertical direction. Accordingly, a separated portion 231 may be formed between adjacent filter units 233 to allow air to flow. An upper surface part 248 may be formed at an upper end of the first filter 230, and a lower surface part 249 may be formed at a lower end of the first filter 230. An upper surface of the upper surface part 248 and a lower surface of the lower surface part 249 may be in contact with a surface of the housing 110 forming the opening 114. The upper surface part 248 and the lower surface part 249 may be disposed parallel to the upper and lower surfaces of the housing 110, respectively. The upper surface part 248 may be integrally formed with the filter unit 233 being disposed at the uppermost end of the plurality of filter units 233. The lower surface part 249 may be integrally formed with the filter unit 233 being disposed at the lowermost end among the plurality of filter units 233.

A part of the lower surface of the upper surface part 248 and a part of the upper surface of the lower surface part 249 are in contact with the upper and lower surfaces of the second filter 250, respectively, so that the second filter 250 may be supported so as not to flow in a vertical direction.

A coupling hole 232 to which the first rib 218 is being coupled may be formed on a side surface of the filter unit 233. A cross-sectional shape of the coupling hole 232 may be formed to correspond to a cross-sectional shape of the first rib 218. For example, the cross-sectional shape of the coupling hole 232 may have an inclined shape in which the distance to the lower surface of the housing 110 becomes closer as it travels in a direction towards the side surface part 214, that is, in a direction towards the hooking part 212. Due to the coupling hole 232, an inner space of the filter unit 233 may be hollow.

The filter unit 233 may be formed with a through hole 234 penetrating the outside of the coupling hole 232 and the filter unit 233 in a region facing another filter unit 233. The space inside the coupling hole 232 may communicate with the outside through the through hole 234. The through hole 234 may have a shape in which a portion of the filter unit 233 is cut out in a lengthwise direction. Due to the through hole 234 communicating a region inside the coupling hole 232 with an external region, the first rib 218 may be more easily inserted into the coupling hole 232.

An inner plate part 236 may be disposed inside the filter unit 233. The inner plate part 236 may be disposed horizontally with the second filter 250. The inner plate part 236 may be disposed in a region between the plurality of second ribs 220 in a vertical direction, which is a lengthwise direction of the frame 210. An inner surface of the inner plate part 236 may be in contact with an outer surface of the second filter 250. The inner ends of the upper surface part 248 and the lower surface part 249 may be protruded more inward than the inner surface of the inner plate part 236.

The filter unit 233 may be inclined so that the distance to the lower surface of the housing 110 decreases as it travels towards the outside. An inclined surface may be formed on an upper surface of the filter unit 233 so that the distance to the lower surface of the housing 110 decreases as it travels towards the outside. Accordingly, when moisture including rain flows in from the outside of the housing 110, it may fall to the outside of the housing 110 through the inclined surface. A rounded surface 239 may be formed on an outer end portion of the filter unit 233 so that moisture easily falls. An inclination angle a (see FIG. 3) of the filter unit 233 may be an acute angle with respect to an imaginary axis X, which is a horizontal direction perpendicular to the vertical direction of the power conversion apparatus 100. An inclination angle a of the filter unit 233 may be an acute angle with respect to a horizontal plane of the power conversion apparatus 100.

A region, in which at least a portion thereof is formed to be perpendicular to the horizontal plane, may be disposed on an outer surface of the filter unit 233.

The second filter 250 may be disposed at an inner side of the first filter 230. The second filter 250 may include a second filter frame 251 forming an edge and a filter part being disposed at an inner side of the second filter frame 251 and including a plurality of through holes 252. The second filter 250 may prevent inflow of foreign substances into the housing 110 through the plurality of through holes 252. A portion of the outer surface of the second filter 250 may come into contact with an inner surface of the first filter 230. As described above, the second filter 250 is interposed between the second rib 220 and the bent portion 216 and may be coupled to the frame 210. Upper and lower ends of the second filter 250 may be respectively supported on a lower surface of the upper surface part 248 and an upper surface of the lower surface part 249.

According to the configuration as described above, there are advantages in that it is possible to prevent moisture and foreign substances from entering from the external region through the double filter structure including the first filter 230 and the second filter 250 while securing an air flow path for heat dissipation.

Meanwhile, in the present embodiment, the filter structure through the single opening 114 in the housing 110 has been described, but is not limited thereto, and of course a plurality of openings may be formed in the housing 110, and the aforementioned filter module may be disposed in each opening.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. A power conversion apparatus comprising:
a housing including an opening; and
a filter module being coupled to the opening,
wherein the filter module includes:
    a first filter;
    a second filter being disposed inside the first filter; and
    a frame being coupled to side surfaces of the first filter and the second filter,
wherein the first filter includes a plurality of filter units being spaced apart in a vertical direction,
wherein an upper surface of at least one filter unit of the plurality of filter units has an inclined surface formed thereon such that a distance to a bottom surface of the housing becomes closer as it travels towards an outside,
wherein a first rib being protruded inward is formed on an inner surface of the frame,
wherein a coupling hole to which the first rib is coupled is disposed on a side surface of the at least one filter unit of the plurality of filter units, and
wherein a through hole communicating with the coupling hole is disposed on a lower surface of the at least one filter unit of the plurality of filter units.

2. The power conversion apparatus according to claim 1, wherein the second filter includes a plurality of through holes.

3. The power conversion apparatus according to claim 1, wherein an outer end portion of the at least one filter unit of the plurality of filter units is formed to be rounded.

4. The power conversion apparatus according to claim 1, wherein the frame includes:
    a side surface part,
    a bent portion being bent from a side end portion of the side surface part, and
    a second rib being protruded from an inner surface of the side surface part, and
    wherein the second filter is disposed between the second rib and the bent portion.

5. The power conversion apparatus according to claim 4, wherein each of the first rib and the second rib is provided in plurality and spaced apart from each other in the vertical direction, and
wherein the plurality of first ribs are disposed to be overlapped with a region between the plurality of second ribs.

6. The power conversion apparatus according to claim 5, wherein an inner plate part being in contact with an outer surface of the second filter is disposed at an inner side of the at least one filter unit of the plurality of filter units, and
wherein the inner plate part is disposed between the plurality of second ribs in the vertical direction.

7. The power conversion apparatus according to claim 1, further comprising an upper surface part being disposed at an upper end of the first filter and a lower surface part being disposed at a lower end of the first filter,
wherein a lower surface of the upper surface part is in contact with an upper surface of the second filter, and
wherein an upper surface of the lower surface part is in contact with a lower surface of the second filter.

8. The power conversion apparatus according to claim 4, wherein the frame further includes a hooking part being protruded from the side surface part and coupled to an outer surface of the housing.

9. The power conversion apparatus according to claim 1, wherein the at least one filter unit of the plurality of filter units has an acute angle with respect to an imaginary axis X forming a horizontal direction of the housing.

10. The power conversion apparatus according to claim 1, wherein the frame is hook-coupled to the housing.

11. The power conversion apparatus according to claim 4, wherein a thickness of the side surface part is greater than a thickness of the housing.

12. The power conversion apparatus according to claim 1, wherein the opening is formed in a side surface of the housing.

13. A power conversion apparatus comprising:
a housing including an opening; and
a filter module being coupled to the opening,
wherein the filter module includes:
a first filter;
a second filter being disposed inside the first filter; and
a frame being coupled to side surfaces of the first filter and the second filter,
wherein the first filter includes a plurality of filter units being spaced apart in a vertical direction,
wherein an upper surface of at least one filter unit of the plurality of filter units has an inclined surface formed thereon such that a distance to a bottom surface of the housing becomes closer as it travels towards an outside,
wherein a first rib being protruded inward is formed on an inner surface of the frame,
wherein a coupling hole to which the first rib is coupled is disposed on a side surface of the at least one filter unit of the plurality of filter units, and
wherein the first rib and the coupling hole each have an inclined shape with respect to an upper or lower surface of the housing.

14. A power conversion apparatus comprising:
a housing including an opening; and
a filter module being coupled to the opening,
wherein the filter module includes:
a first filter including a plurality of filter units and a spacer formed between the plurality of filter units;
a second filter being disposed inside the first filter; and
a frame being coupled to side surfaces of the first filter and the second filter,
wherein a coupling hole is formed on a side surface of at least one filter unit of the plurality of filter units,
wherein a first rib coupled to the coupling hole is disposed on an inner surface of the frame facing the coupling hole,
wherein the frame includes:
a side surface part;
a bent portion being bent from a side end portion of the side surface part; and
a second rib being protruded from an inner surface of the side surface part,
wherein the second filter is disposed between the second rib and the bent portion,
wherein each of the first rib and the second rib is provided in plurality and spaced apart from each other in a vertical direction,
wherein the plurality of first ribs are disposed to be overlapped with a region between the plurality of second ribs,
wherein an inner plate part being in contact with an outer surface of the second filter is disposed at an inner side of the at least one filter unit of the plurality of filter units, and
wherein the inner plate part is disposed between the plurality of second ribs in the vertical direction.

15. The power conversion apparatus according to claim 14, wherein the at least one filter unit of the plurality of filter units has an acute angle with respect to an imaginary axis X forming a horizontal direction of the housing.

* * * * *